United States Patent
Zelner et al.

(10) Patent No.: US 8,154,850 B2
(45) Date of Patent: Apr. 10, 2012

(54) SYSTEMS AND METHODS FOR A THIN FILM CAPACITOR HAVING A COMPOSITE HIGH-K THIN FILM STACK

(75) Inventors: Marina Zelner, Burlington (CA); Mircea Capanu, St. Catharines (CA); Susan C. Nagy, Burlington (CA)

(73) Assignee: Paratek Microwave, Inc., Nashua, NH (US)

( * ) Notice: Subject to any disclaimer, the term of this patent is extended or adjusted under 35 U.S.C. 154(b) by 975 days.

(21) Appl. No.: 12/117,099

(22) Filed: May 8, 2008

(65) Prior Publication Data

US 2008/0278887 A1    Nov. 13, 2008

Related U.S. Application Data

(60) Provisional application No. 60/917,371, filed on May 11, 2007.

(51) Int. Cl.
*H01G 4/06* (2006.01)

(52) U.S. Cl. ........... 361/313; 361/311; 361/301.4; 361/321.1; 361/321.2; 361/303

(58) Field of Classification Search .......... 361/313, 361/311, 321.1, 321.2, 306.1, 306.3, 301.4
See application file for complete search history.

(56) References Cited

U.S. PATENT DOCUMENTS

| | | | |
|---|---|---|---|
| 5,811,181 A * | 9/1998 | Kijima et al. | 428/328 |
| 6,194,753 B1 | 2/2001 | Seon et al. | |
| 6,440,591 B1 * | 8/2002 | Matsunaga et al. | 428/699 |
| 6,777,776 B2 * | 8/2004 | Hieda | 257/532 |
| 2003/0133250 A1 | 7/2003 | Norga et al. | |
| 2004/0175585 A1 | 9/2004 | Zou et al. | |
| 2005/0064605 A1 | 3/2005 | Lee et al. | |

OTHER PUBLICATIONS

International Search Report of PCT/CA2008/000906, dated Aug. 28, 2008 (3 pages).

* cited by examiner

*Primary Examiner* — Nguyen T Ha
(74) *Attorney, Agent, or Firm* — Andrew Gust; Guntin Meles & Gust, PLC

(57) ABSTRACT

Systems and methods are provided for fabricating a thin film capacitor involving depositing an electrode layer of conductive material on top of a substrate material, depositing a first layer of ferroelectric material on top of the substrate material using a metal organic deposition or chemical solution deposition process, depositing a second layer of ferroelectric material on top of the first layer using a high temperature sputter process and depositing a metal interconnect layer to provide electric connections to layers of the capacitor.

31 Claims, 4 Drawing Sheets

SYSTEMS AND METHODS FOR A THIN FILM CAPACITOR HAVING A COMPOSITE HIGH-K THIN FILM STACK

CROSS-REFERENCE TO RELATED APPLICATION

This application claims priority from and is related to U.S. Provisional Patent Application No. 60/917,371, filed on May 11, 2007, the entirety of which is incorporated herein by reference.

FIELD

The technology described in this patent document relates generally to the field of thin film devices and fabrication. More particularly, the patent document describes a composite high-k thin film stack for improving the time-dependent dielectric breakdown (TDDB) of a thin film capacitor.

BACKGROUND

Ferroelectric capacitors have potential use as decoupling or voltage-tunable capacitors (varactors) in RF systems. Some benefits of ferroelectric capacitors are small size, integration of different values and functions of capacitance, and low cost. Applications for ferroelectric capacitors may include tunable filters, voltage-controlled oscillators, tunable phase shifters, tunable matching networks, low-impedance power supplies, decoupling high-frequency signals at an IC bonding pad, or others. Integrated circuits including ferroelectric capacitors may, for example, be used in portable electronics for low-power wireless communication (e.g., cellular phones, pagers, PDAs, etc.), directional antenna systems, high clock-rate microphones, miniature DC to DC converters, or other devices.

A ferroelectric capacitor may be fabricated by depositing a ferroelectric film on an electrode layer and then depositing a second electrode layer over the ferroelectric film. The deposition technique can be sputtering, chemical vapor deposition (CVD) of any kind (including ALD and CCVD), or pulsed laser deposition (PLD). The ferroelectric film can be Barium Strontium Titanate (BST), Strontium Bismuth Tantalate (SBT), Lead Zirconate Titanate (PZT), Lead Lanthanum Zirconate Titanate (PLZT) or any other perovskite or pyrochlore phase ferroelectric film or a combination thereof. The electrode can be made of any metal or conductive oxide or any combination of these materials. Preferred in this embodiment is Platinum, Platinum alloy, Iridium either solely or in combination with Iridium Oxide, Ruthenium Oxide, or Strontium Ruthenium Oxide (SRO). Sputtered ferroelectric films have a columnar morphology with a pronounced preferential orientation that is perpendicular to the electrodes. As a result, sputter deposited perovskite films have a high tuning and capacitance density. However, the TDDB behavior of the ferroelectric capacitor is adversely affected by the crystalline columnarity of the ferroelectric film because grain boundaries are aligned perpendicular to the electrodes. The technology described herein provides a modification to the columnarity of the sputtered ferroelectric film, which breaks up charged carrier migration through the film and thus improves the TDDB of the capacitor.

SUMMARY

A capacitor structure is provided that includes a first electrode layer of conductive material, a dielectric formed from a ferroelectric layer deposited in a manner that forms a columnar grain structure and a ferroelectric layer deposited in a manner that forms a randomly-oriented grain structure, and a second electrode layer of conductive material on top of the dielectric layer.

Additionally, a tunable thin film capacitor structure is provided including a first electrode layer of conductive material, a ferroelectric seed layer having randomly distributed grains deposited on top of the first electrode layer, a high temperature sputter applied dielectric layer deposited on top of the seed layer, and a second electrode layer of conductive material on top of the dielectric layer.

Further, a method for fabricating a thin film capacitor is provided that includes depositing an electrode layer of conductive material on top of a substrate material, depositing a first layer of ferroelectric material on top of the substrate material in a manner that forms a randomly-oriented grain structure, depositing a second layer of ferroelectric material on top of the first layer using a high temperature sputter process in a manner that forms a columnar-oriented grain structure, and depositing a metal interconnect layer to provide electric connections to layers of the capacitor.

DETAILED DESCRIPTION

The columnarity of a ferroelectric film may be modified by depositing a very thin layer (seed layer) of a ferroelectric material with randomly distributed grains prior to the sputter deposition of the ferroelectric film. The ferroelectric seed layer with randomly distributed grains may be deposited using any kind of Metal Organic Deposition (MOD) or Chemical Solution Deposition (CSD) technology. The deposition method can be either spin-on or misted deposition with subsequent thermal processing. Thermal processing may include hot plate bakes, oven bakes, rapid thermal processing (RTP), vacuum bakes (including in-situ bake while sputtering) or high temperature anneals. The ferroelectric film is then deposited over the thin seed layer using one of the deposition methods mentioned above. In this manner, the randomly distributed grains in the seed layer will distort the preferred orientation of crystalline columnarity in the deposited ferroelectric film and also interrupt the vertically-oriented grain boundaries resulting in an improvement in the TDDB behavior of the capacitor.

Figure 1:
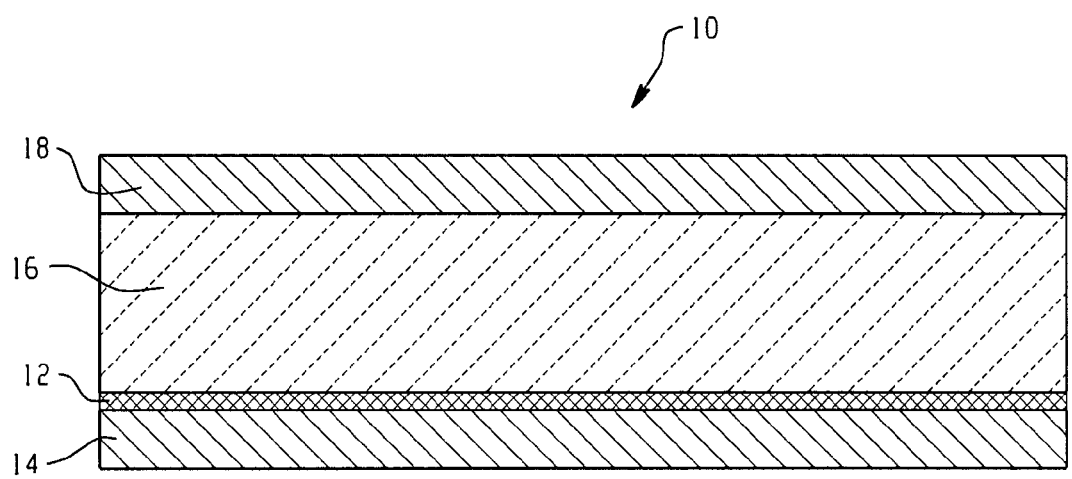
FIG. 1 depicts an example ferroelectric capacitor that includes a thin seed layer between the lower electrode and the dielectric layer.

FIG. 1 depicts an example ferroelectric capacitor 10 that includes a thin seed layer 12 between the lower electrode 14 and the dielectric layer 16. The capacitor structure 10 includes two conducting electrodes 14, 18 that are separated by the thin seed layer 12 and the dielectric layer 16. The conducting electrodes 14, 18 may, for example, be fabricated using platinum or a platinum alloy. The seed layer 12 is fabricated by depositing a thin layer of ferroelectric material (e.g., BST) on the lower electrode 14, for example using MOD technology (e.g., spin coating). The seed layer 12 should preferably be as thin as possible because a thick seed layer may adversely affect the operation of the capacitor 10. The dielectric layer 16 is fabricated by depositing a ferroelectric material, such as BST, using a high temperature sputter process. The capacitor 10 may, for example, be fabricated on a substrate material coated with one or more insulating layers (not shown).

As described above, the thin seed layer 12 distorts the orientation of crystalline columnarity in the sputtered (CVD or PLD deposited) ferroelectric film 16 resulting in improved TDDB behavior of the capacitor 10. In addition, the thin seed layer 12 may heal and planarize possible defects and roughness in the electrode 14 such that the sputtered (or other columnar) film 16 is deposited onto a very smooth and defect free surface. A low temperature MOD seed layer 12 may protect the electrode 14 during the high temperature sputtering process, preventing possible damage (e.g., increased roughness, etc.) A combination of an undoped BST and a doped BST formulation, or a combination of different ferroelectric materials may also be beneficial in other ways, such as minimizing the space charge, and improving the temperature dependence of dielectric properties.

Figure 2:
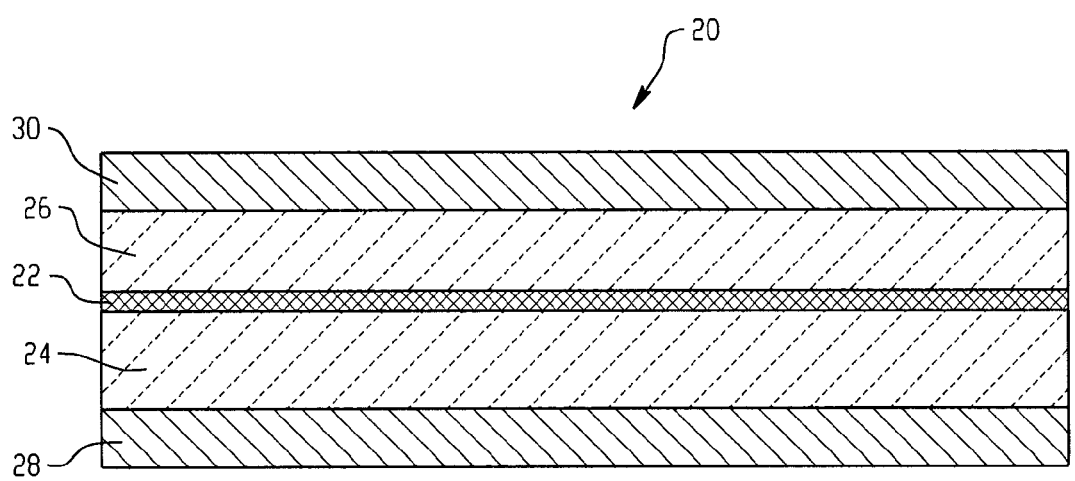
FIG. 2 depicts another example ferroelectric capacitor that includes a thin seed layer.

FIG. 2 depicts another example ferroelectric capacitor 20 that includes a thin seed layer 22. In this example, the thin seed layer 22 is deposited between two columnar dielectric layers 24, 26. A first ferroelectric layer 24 is deposited on a lower electrode 28. The seed layer 12 is then fabricated by depositing a thin layer of the ferroelectric material (e.g., BST or other ferroelectric with randomly distributed grains) on the first columnar-oriented ferroelectric layer 24, for example using MOD technology. A second columnar-oriented ferroelectric layer 26 is fabricated by a deposition technique such as sputtering over the seed layer 22. An upper electrode 30 is then fabricated over the upper dielectric layer 26 to form the capacitor structure 20.

The fabrication processes described above with reference to FIGS. 1 and 2 may be repeated to form multi-layer capacitor structures. An example process for fabricating a multi-layer capacitor structure is illustrated in FIG. 3. In step 50 (FIG. 3A), one or more insulating layers 60 are deposited on a substrate material 62. The substrate 62 may, for example, be Silicon, Alumina (including glazed and ZTA), Sapphire, Silicon Carbide, Magnesium Silicate (including Foresterite) or any other type of insulating, semi-insulating or semi-conducting material. The insulating layers 60 may include an insulating layer such as $SiO_2$ and a hermetic insulating layer, such as $Si_3N_4$.

Figure 3A:
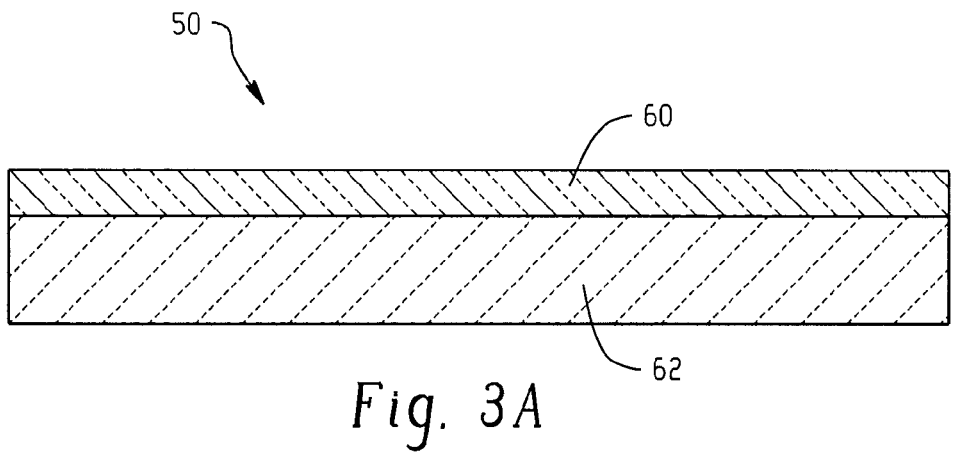
FIG. 3 depicts an example process for fabricating a multilayer capacitor structure.
Figure 3B:
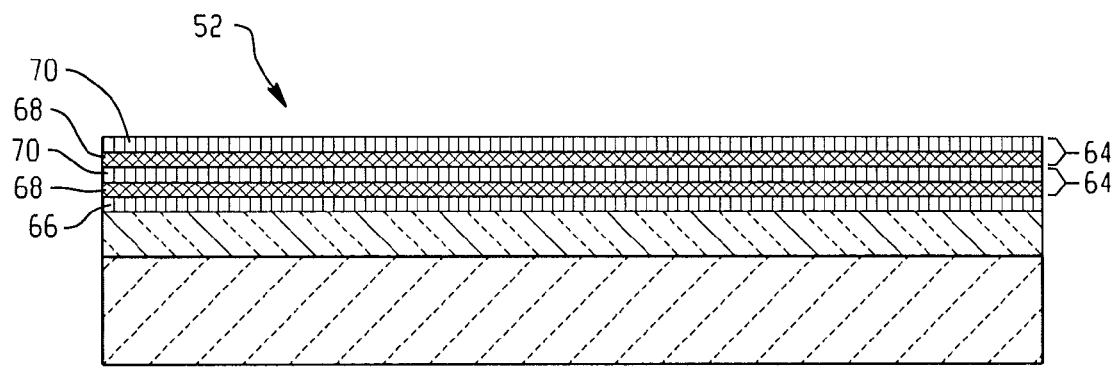
Figure 3C:
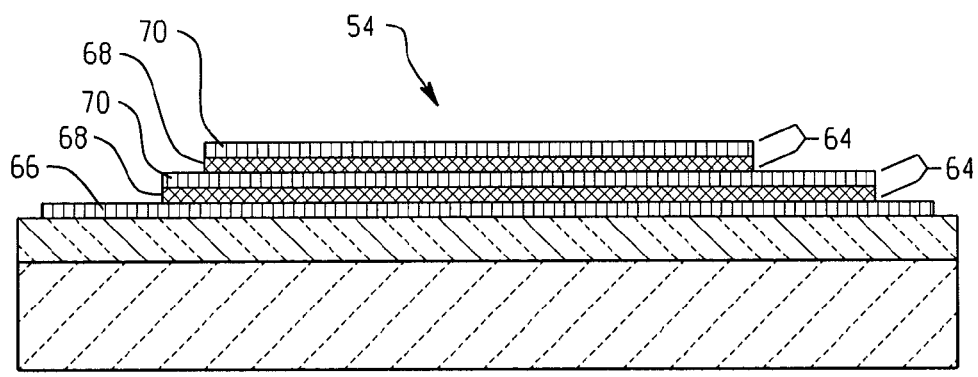
Figure 3D:
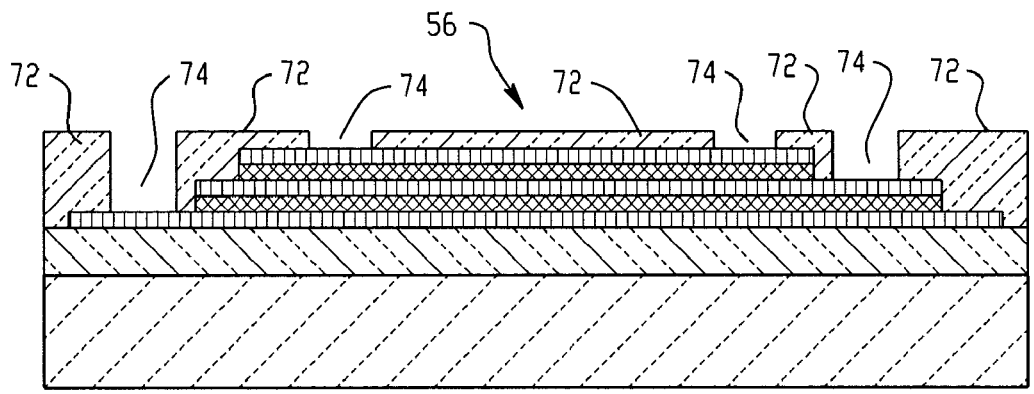
Figure 3E:
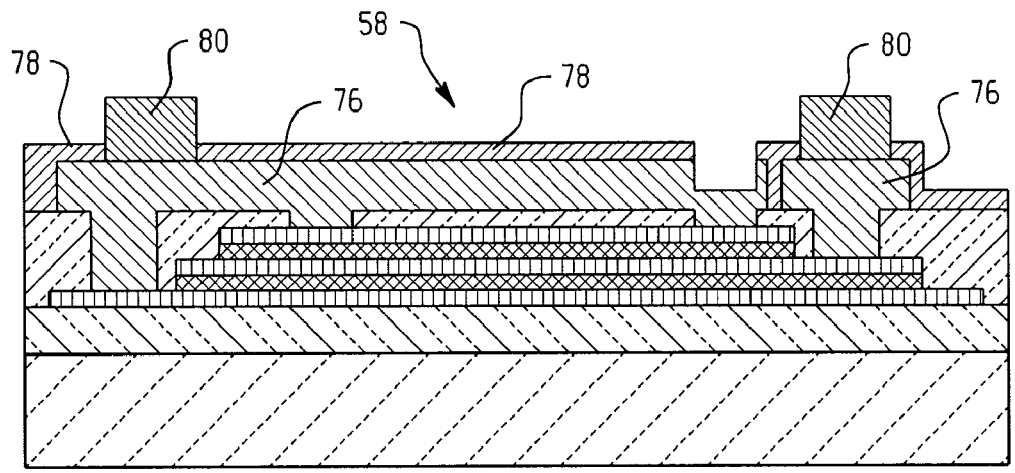
Figure 3F:
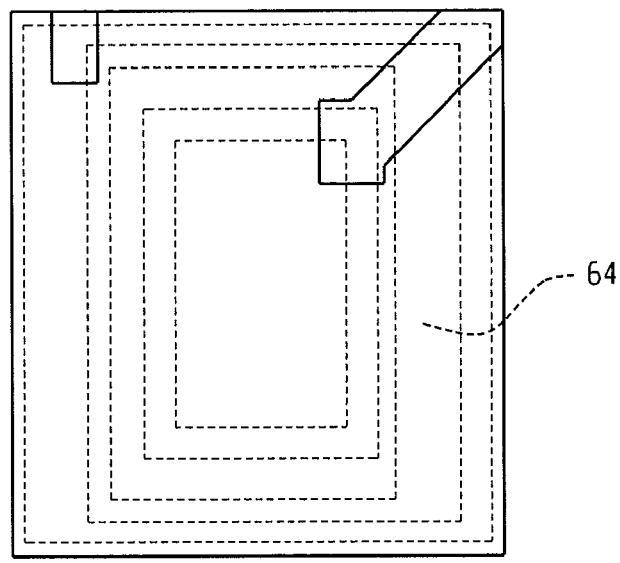

In step 52 (FIG. 3B), multiple capacitor layers 64 are fabricated on top of a deposited electrode layer 66, for example using the process described above with reference to FIG. 1. In this example, two capacitor layers 64 are illustrated, each having a 0.06 um MOD seed layer of BST 68 and a 0.23 um layer of sputtered BST 70 deposited over the seed layer 68. In step 54 (FIG. 3C), the capacitor layers 64 are patterned to form a mesa structure, such that each electrode layer 66 is accessible. In step 56 (FIG. 3D), a planarizing and insulating layer 72 (e.g., an ILD glass layer) is deposited, patterned and etched to form vias 74. In step 58 (FIG. 3E), a metal interconnect layer 76 is deposited that provides an electrical connection to the electrodes. A nitride overcoat 78 is deposited to protect the metal interconnect layer 76 and gold bumps 80 are deposited to provide electrical contacts for final packaging. A top view of the capacitor structure depicting the mesa shaped capacitor layers 74, is also illustrated in FIG. 3F.

Tests of the capacitor structure shown in FIGS. 3A-3F demonstrated an increase in the lifetime of the BST capacitors by at least one order of magnitude at accelerated stress conditions of 125-150 C and 83-100 V/um. For instance, under stress conditions of 125 C and 85V/um, wafers fabricated using this process had no TDDB failures over 1500 hours of testing, while a wafer processed using the standard procedure (i.e. a sputtered BST film with no seed layer) had all devices fail, with an average lifetime of 83 hours.

Figure 4:
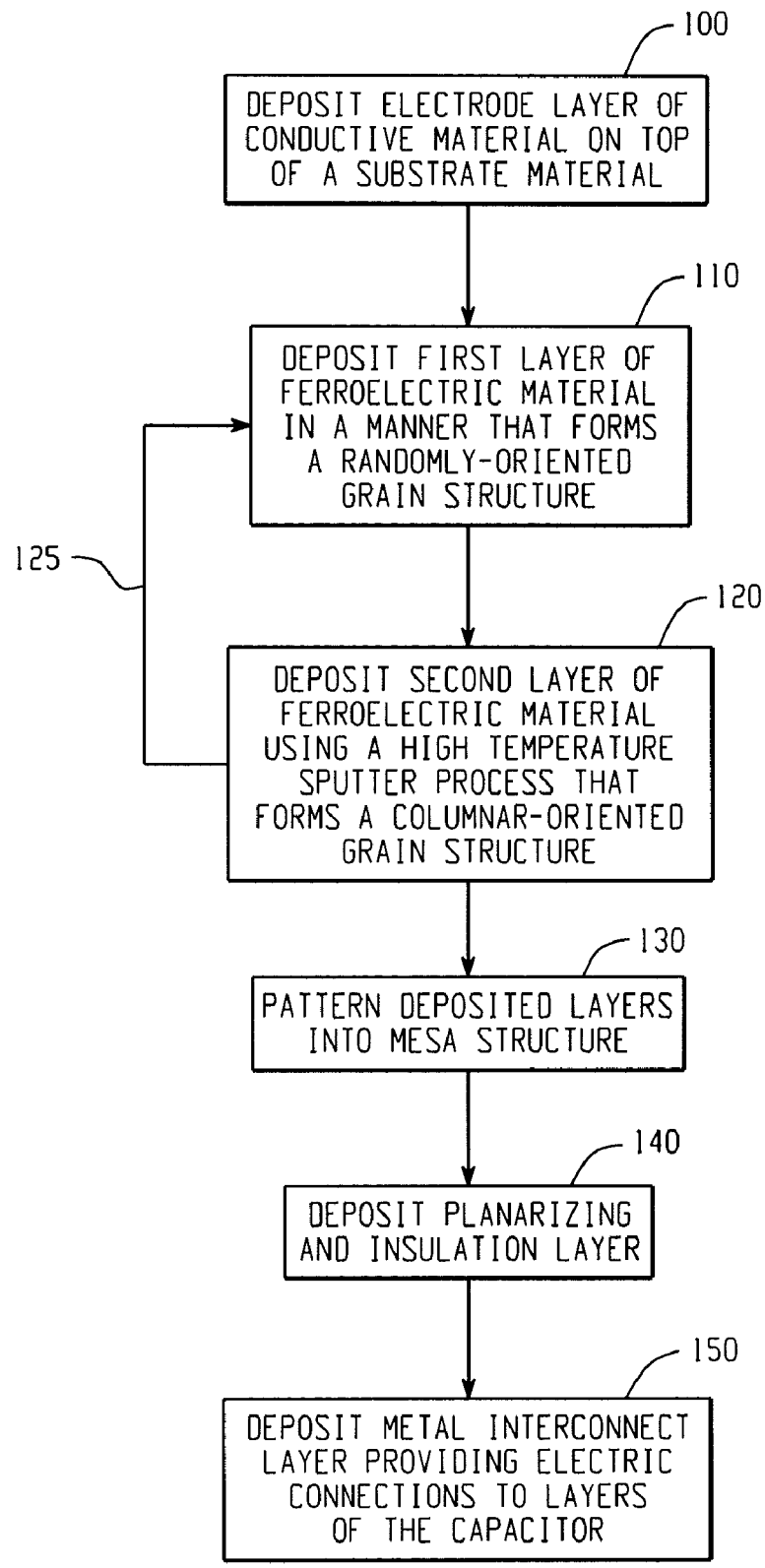
FIG. 4 is a flow diagram depicting the process of fabricating a multilayer capacitor structure.

FIG. 4 is a flow diagram depicting an example process of fabricating a multilayer capacitor structure. At step 100 where an electrode layer of conductive material is deposited. This electrode layer may be deposited directly onto a substrate or may be deposited onto a substrate that has previously had an insulating layer deposited.

Following deposition of the electrode layer in step 100, a first layer of ferroelectric material is deposited on top of the layer of conductive material in step 110. This layer of ferroelectric material heals and planarizes possible defects and roughness in the electrode layer. The first layer of ferroelectric material may be deposited using any kind of Metal Organic Deposition (MOD) or Chemical Solution Deposition (CSD) technology. Examples of these technologies are spin-on deposition and misted deposition. This first layer of ferroelectric material may have a randomly oriented grain structure that will distort the preferred orientation of the crystalline columnarity in the deposited ferroelectric film and also interrupt the vertically-oriented grain boundaries resulting in an improvement in the TDDB behavior of the capacitor.

The previously referred to second layer of ferroelectric material is deposited on top of the first layer of ferroelectric material in step 120. This second layer of ferroelectric material is deposited using a high temperature sputter process and may have a columnar oriented grain structure as previously described. The steps of depositing the first layer of ferroelectric material 110 and depositing the second layer of ferroelectric material 120 may be repeated as desired to form several capacitor layers as shown in step 125.

Once the desired number of capacitor layers have been deposited, the deposited capacitor layers may be patterned into a mesa structure in step 130. Patterning the capacitor layers into a mesa structure offers access to all electrode layers and capacitor layers for later applied structures.

In step 140, a planarizing and insulating layer is deposited on top of the previously deposited layers. The planarizing and insulating layer is etched to form a set of pathways or vias in the capacitor structure. These etched vias offer conduits for metal interconnection materials to be deposited in step 150.

Following deposition and etching of the planarizing and insulating layer in step 140, one or more metal interconnect layers are deposited in step 150. This metal interconnect layer creates the electrical connections to the previously deposited structures in steps 100-140. Following deposition of the metal interconnect layer, an additional layer of protective material such as a nitride overcoat may be deposited on top of the metal interconnect layer and gold bumps may be attached to the metal connections to help protect the previously deposited structures.

This written description uses examples to disclose the invention, including the best mode, and also to enable a person skilled in the art to make and use the invention. The patentable scope of the invention may include other examples that occur to those skilled in the art.

It is claimed:

1. A method for fabricating a thin film capacitor, comprising:
    depositing an electrode layer of conductive material on top of a substrate material;
    depositing a first layer of a first ferroelectric material on top of the electrode layer utilizing a deposition process that forms a randomly-oriented grain structure;
    depositing a second layer of a second ferroelectric material on top of the first layer using a high temperature sputter process in a manner that forms a columnar-oriented grain structure, wherein one of the first or second ferroelectric materials is a doped barium strontium titanate material and the other of the first or second ferroelectric materials is an undoped barium strontium titanate material; and depositing a metal interconnect layer to provide electric connections for the capacitor.

2. The method of claim 1, further comprising depositing one or more sets of additional alternating first and second layers of the first and second ferroelectric materials, wherein the additional first layers are deposited using a metal organic deposition or chemical solution deposition process and wherein the additional second layers are deposited using a high temperature sputter process before depositing the metal interconnect layer.

3. The method of claim 1, further comprising patterning the first and second layers to form a mesa structure following depositing the first and second layers.

4. The method of claim 3, further comprising:
depositing a planarizing and insulating layer following the patterning of the first and second layers; and
etching the planarizing and insulating layer to form vias.

5. The method of claim 4, wherein the metal interconnect layers are deposited in the formed vias to provide electric connections to layers of the capacitor.

6. The method of claim 5, further comprising depositing an insulating layer onto the substrate material before depositing the first layer of the first ferroelectric material.

7. The method of claim 1, wherein the first layer of the first ferroelectric material is deposited by a spin-on process.

8. The method of claim 1, wherein the first layer of the first ferroelectric material is deposited by a misted deposition process.

9. The method of claim 1, wherein the first layer of the first ferroelectric material comprises the undoped Barium Strontium Titanate material.

10. The method of claim 1, wherein the first layer of the first ferroelectric material is deposited such that the first layer of the first ferroelectric material planarizes the first electrode layer.

11. The method of claim 1, wherein the first layer of the first ferroelectric material is deposited by a metal organic deposition process.

12. The method of claim 11, wherein the first layer of the first ferroelectric material is deposited by a chemical solution deposition process.

13. The method of claim 1, wherein the first layer of the first ferroelectric material is deposited about 0.06 µm in thickness.

14. The method of claim 1, wherein the second layer of the second ferroelectric material is deposited about 0.23 µm in thickness.

15. A method for fabricating a thin film capacitor, comprising:
depositing an electrode layer of conductive material on top of a substrate;
depositing a first layer of ferroelectric material on top of the electrode layer in a manner that forms a randomly-oriented grain structure;
depositing a second layer of ferroelectric material on top of the first layer of ferroelectric material using a high temperature sputter process in a manner that forms a columnar-oriented grain structure; and
depositing a metal interconnect layer to provide electric connections to the capacitor, wherein the second layer of ferroelectric material is deposited such that the second layer is about six times as thick as the first layer of ferroelectric material.

16. The method of claim 15, comprising depositing an insulating layer onto the substrate material before depositing the first layer of ferroelectric material.

17. The method of claim 16, wherein the first layer of ferroelectric material and the second layer of ferroelectric material are different materials.

18. The method of claim 16, wherein one of the first or second layers of ferroelectric material is a doped barium strontium titanate material and the other of the first or second layers of ferroelectric material is an undoped barium strontium titanate material.

19. The method of claim 15, wherein the first layer of ferroelectric material is deposited by a spin-on process.

20. The method of claim 15, wherein the first layer of ferroelectric material is deposited by a misted deposition process.

21. The method of claim 15, comprising:
depositing a planarizing and insulating layer following patterning of the first and second layers; and
etching the planarizing and insulating layer to form vias.

22. The method of claim 21, wherein the metal interconnect layer is deposited in the formed vias to provide electric connections to the capacitor.

23. A method for fabricating a thin film capacitor, comprising:
depositing a seed layer of ferroelectric material on top of an electrode layer utilizing a deposition process that forms a randomly-oriented grain structure;
depositing a second layer of ferroelectric material on top of the first layer using a high temperature sputter process in a manner that forms a columnar-oriented grain structure; and
depositing a metal interconnect layer to provide electric connections for the capacitor.

24. The method of claim 23, comprising depositing the electrode layer of conductive material on top of a substrate material.

25. The method of claim 24, comprising depositing an insulating layer onto the substrate material before depositing the seed layer of ferroelectric material.

26. The method of claim 23, wherein the seed layer of ferroelectric material and the second layer of ferroelectric material are different materials.

27. The method of claim 23, wherein one of the seed layer of ferroelectric material or the second layer of ferroelectric material is a doped barium strontium titanate material and the other of the seed layer of ferroelectric material or the second layer of ferroelectric material is an undoped barium strontium titanate material.

28. The method of claim 23, wherein the seed layer of ferroelectric material is deposited by a spin-on process.

29. The method of claim 23, wherein the seed layer of ferroelectric material is deposited by a misted deposition process.

30. The method of claim 23, comprising:
depositing a planarizing and insulating layer following the patterning of the seed and second layers; and
etching the planarizing and insulating layer to form vias.

31. The method of claim 30, wherein the metal interconnect layer is deposited in the formed vias to provide electric connections to the capacitor.

* * * * *